United States Patent [19]

Metcalfe et al.

[11] Patent Number: 4,869,380

[45] Date of Patent: Sep. 26, 1989

[54] FRAME WORK

[75] Inventors: George T. Metcalfe, Krugersdorp; Alan Burton, Edenvale, both of South Africa

[73] Assignee: Vormet Quality Fabrication Close/Corporation, Randburg, South Africa

[21] Appl. No.: 102,360

[22] Filed: Sep. 25, 1987

[30] Foreign Application Priority Data

Sep. 26, 1986 [ZA] South Africa .................. 86/7340

[51] Int. Cl.⁴ .................................. A47B 47/00
[52] U.S. Cl. ................................ 211/189; 361/429
[58] Field of Search .............. 211/189, 191, 182, 194; 312/140, 257 R, 5 K; 403/205, 403; 361/429

[56] References Cited

U.S. PATENT DOCUMENTS

| 3,545,625 | 12/1970 | MacMillian | 211/189 |
| 3,919,603 | 11/1975 | Salvati et al. | 211/182 X |
| 4,045,104 | 8/1977 | Peterson | 211/182 X |
| 4,545,490 | 10/1985 | Hsiao et al. | 211/191 |

*Primary Examiner*—Sarah A. Lechok
*Attorney, Agent, or Firm*—Mason, Fenwick & Lawrence

[57] ABSTRACT

A frame for mounting electrical and electronic equipment has its horizontal and vertical members connected together at each corner by identical corner blocks with three wings at right angles to one another, with which the ends of the members are telescopically engaged and to which they are bolted. Racks are provided for mounting equipment or for trays or shelves in a number of positions. At each corner of the frame a vertical rod passes through holes in the top and corner blocks and a screw nut is engaged with the top of the rod for lifting the frame without damage or distortion.

2 Claims, 2 Drawing Sheets

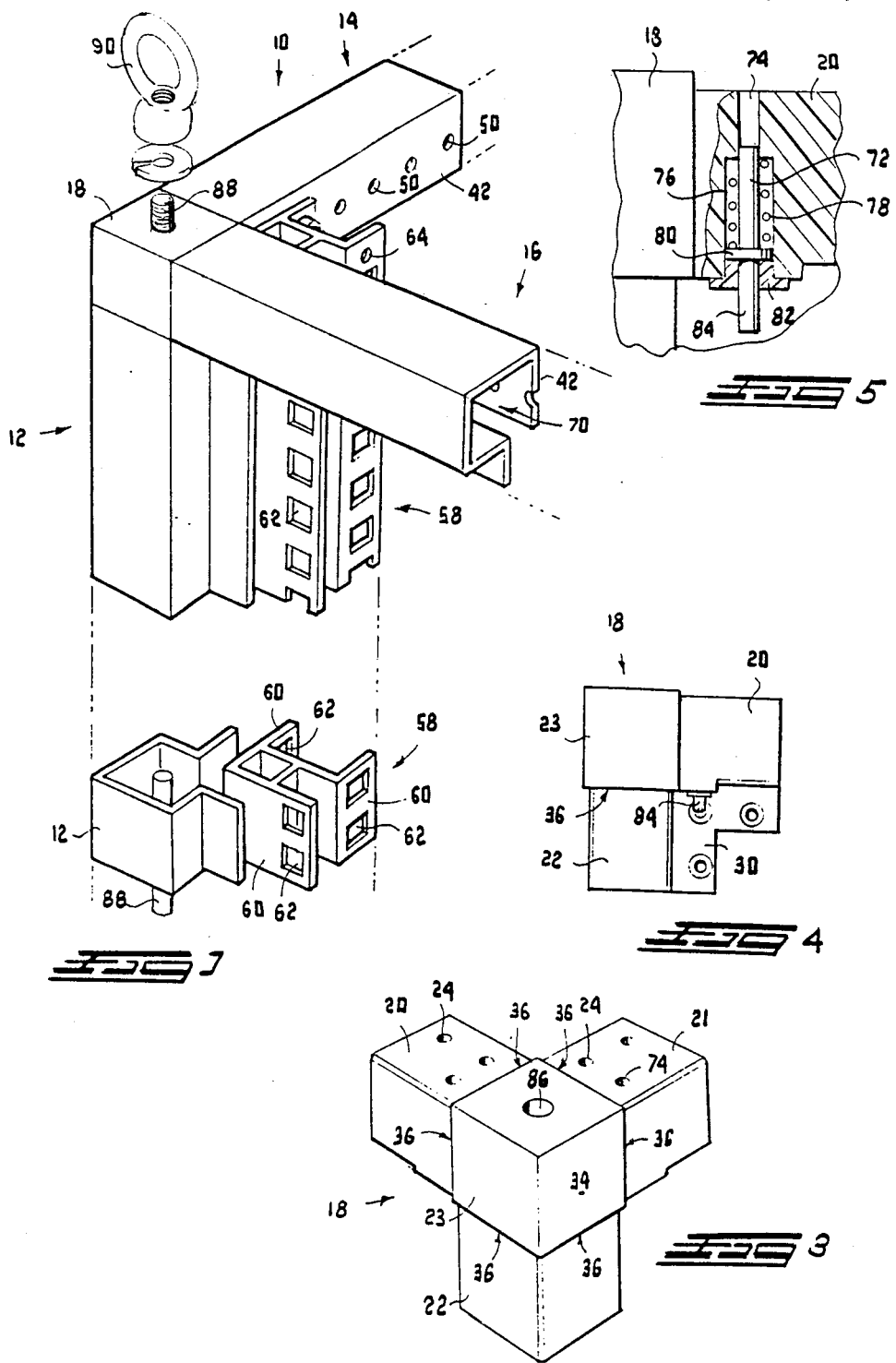

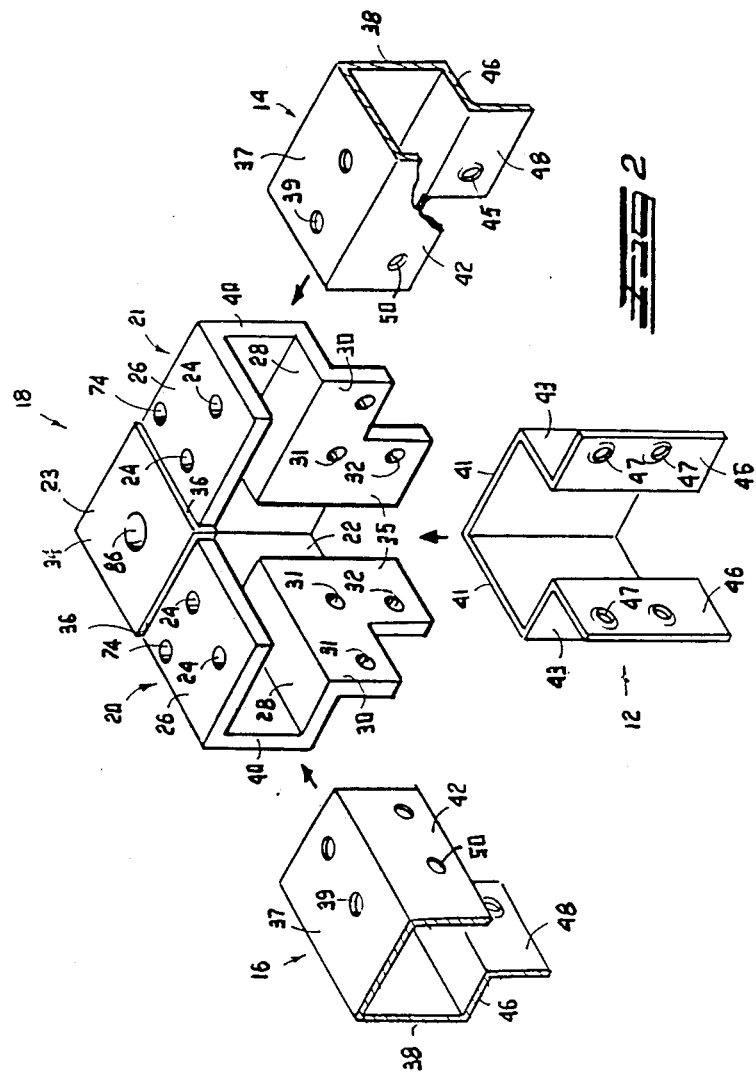

FRAME WORK

FIELD OF THE INVENTION

This invention relates to rectangular prismatic frames such as those which are used for the mounting of electrical and electronic equipment. The frame may be and in most cases is encased in panels to form a cabinet.

BACKGROUND OF THE INVENTION

The usual construction for frames of this kind involves butting or overlapping the meeting ends of the frame members and uniting them by welding. While this method of construction produces an adequate frame, it needs the employment of skilled personnel and has the disadvantages that the frame is an integral unit, cannot be disassembled, and cannot be supplied in knocked-down form for ready and rapid assembly on site by unskilled labour.

In other forms, the members are connected at their corners to connectors but such constructions are apt to be complex, expensive or of doubtful rigidity.

Yet another disadvantage in known electrical cabinet frames is that the rack elements which include vertically aligned slots or holes by means of which equipment or trays are located in the frames are immovable and are generally formed integrally with the vertical corner posts, so reducing the versatility.

The object of this invention is to provide a frame which avoids these disadvantages while retaining the virtues of the usual frame.

THE INVENTION

According to the invention, a block for uniting the members of the frame has three wings at right angles to one another, each wing being shaped and dimensioned to engage telescopically the end of a frame member; and means is provided to secure the telescoped wings and members together. Such means will usually be bolts or screws.

Further according to the invention, a zone common to all the wings and located at their junction is separated from the remainder of the wings by steps the height of each of which is equal to the thickness of the frame members; and it is the stepped-down portions of the wings that are shaped and dimensioned to enter telescopically into the ends of the members.

The invention includes also a rectangular prismatic frames composed of horizontal and vertical members, united at each of its eight corners by a corner block as descibed above, the wings of the blocks telescoped into the ends of the members, and with bolts through registering holes in the blocks and the telescoped ends.

Racks are provided for mounting components within the frame.

THE DRAWINGS

An embodiment of the invention is seen in the accompanying drawings in which:

FIG. 1 is a perspective view of a portion of the frame;
FIG. 2 is an exploded view of one corner of the frame of FIG. 1;
FIG. 3 is a perspective view of a corner block;
FIG. 4 is a side view of the block; and
FIG. 5 is a fragmentary view of a catch for holding panels or doors on the frame.

BRIEF DESCRIPTION OF THE PREFERRED EMBODIMENT

The frame 10 of the embodiment is made up of four vertical members 12, four members 14 constituting the horizontal front and back elements of the frame, and four members 16 constituting the horizontal side elements.

The various frame members are connected together by corner blocks 18 at the eight corners of the frame. The blocks are identical. Each of them, as is seen in FIG. 2, is characterised by three wings 20,21,22 which project at right angles to one another. Each is of channel section, with two flanges 26 and 28, the latter being of lesser width than the former.

In one form of the invention, two wings 20,21 are each formed with a pair of holes 24 in one flange 26. There is a third hole the purpose of which will be discussed later.

The wing 22 has flanges 30 projecting at right angles to its flanges 28. The flanges 30 have two holes 31. Flanges 35 which are about half the width of the flanges 30, depend from them and have a hole 32.

The hollow cubical element 34 at the junction of the wings (and common to them) is separated from the outer surfaces of the wings by steps 36 the height of each of which is equal to the thickness of the frame members 12,14 and 16.

The members 14,16 are shaped and dimensioned to telescope snugly over the wings 21,20. They are of quasi-box section, as is seen in FIG. 2. The top elements 37 of the box fit over the wings flanges 26, the sides 38 over the walls 40, and the sides 42 over the open faces of the wings. The base 46 of the box underlies the flanges 28. A flange 48 depends from the edge of the base 46 and, as is seen through the cut-away portion of the member 14, is stepped back from the ends of the member by the width of the flanges 35.

The members 12, also of quasi-box shape, have outer walls 41, flanges 43 that are one half the width of the walls 41, and return flanges 46 that each have a pair of counterpressed holes at each end to form a snap-fit in the holes in the corner block.

When the members 12,14,16 are engaged over the wings 22,21,20 respectively, the leading edges of the members butt against the shoulders 36, while the leading edges of the flanges 48 on the members 14 and 16 come up against the vertical edges of the flanges 46 of the member 12. The members 14,16 are fastened to the block by bolts which are passed through the outer holes 31 in the flanges 30 and holes 45 in the flanges 48. Similarly, the members 12 are bolted to the block through their holes 47 which are now in register with the inner hole 31 and the hole 32 of the flanges 35.

Since the height of the shoulders 36 is equal to the thickness of the walls of the members 12,14,16 the assembly has smooth, continuous surfaces over the joints, which enhances the appearance of the frame.

The side 42 of each member 14,16 has a line of holes 50 which are evenly spaced over the length of the members 14 and 16. Holes 24 in the wings and 39 in the members 14,16 are so located as to be in register when the members are telescoped over the wings for receiving bolts, if required, for holding a cover plate (not shown) over the cabinet frame, which enhances the rigidity of the frame.

Electrical or electronic equipment is mounted within the assembled frame on rack elements. These rack elements (one of which is seen in FIG. 1) each consist of a beam 58 of box-like section, with flanges 60 each of which is pierced by a line of holes 62 conveniently of square shape. Holes 64 are provided at each end of the rack for bolting the rack to the flanges 42 of the members 14,16.

A rack is provided at each corner of the assembly. It is bolted to the flanges 42 (top and bottom) of the frame members 14,16, through the registering holes 64 and 50.

Racks can be provided at any position by use of the holes 50 in the members 14,16. Shelves or trays are supported on the racks, as required.

When the racks are bolted to the members 14,16, it will be seen from the lower part of FIG. 1 that they are stepped back from the plane of the flanges 46 of the members 12 towards the interior of the frame. This will enable small items of equipment to be mounted directly on the racks without fouling the doors of the cabinet that may encase the frame.

It is pointed out that the assembled frame has enclosed ducting 70 running continuously around the periphery of the frame through each of the frame members and the corner blocks, so that wiring can be accommodated within the ducting.

The frame may be clad with panels and a door or doors to form a cabinet. The panels may be mounted by providing spring-loaded pins 72 (FIG. 5) that are housed within bores 74 within the walls of the wings 20,21. The bores are counterbored at 76 to accommodate a compression spring 78 between the shoulder of the counterbore and a collar 80 on the pin. The counterbore accommodates a closure plug 82 on which the pin collar 80 seats.

The protruding ends 84 of opposed pins straddle the panel to hold it in place, or they may be engaged in lugs attached to and projecting from the panels.

It will be noted that each block 18 has a hole 86 of which no mention has thus far been made. The purpose of these holes is to allow the frame to be lifted without straining its components. To this end, stout rods 88 are passed vertically through opposed holes 86 in the top and bottom blocks and anchored to the bottom block or to a plinth for supporting the frame by any suitable means, say nuts pulled up against bearing plates or washers.

The upper ends are screw-threaded and protrude sufficiently for eye nuts 90 to be screwed on to each of them. With lifting eye nuts provided at each corner, the frame (or cabinet) can be lifted without fear of distortion or damage, however massive the equipment within it.

The corner blocks are preferably, and, in practice, will be moulded from plastic material. The plastic employed and the thickness of the walls of the wings will, of course, be selected to ensure that the blocks are rigid enough for tying together the assembly, and the lengths of the wings will be such that, when they are telescoped into the ends of the members, there is minimal play so that the function of the bolts is to hold the components from separating without having to guard against distortion by twisting of the components.

The blocks are, to the best of the applicant's knowledge and belief, unique in that they are three-dimensional in the sense that each provides a spigot for the three meeting members at each corner of the frame, to form a corner; and that they are universal in the sense that the same shape of block suffices for each of the eight corners of the frame.

The construction described lends itself readily to assembly from knocked-down kits on site by amateurs since there is only one way in which the assembly can be done and no welding equipment need be provided. Frames can be as easily disassembled as they are assembled.

Savings on storage and transportation of the kits in knocked-down form are further advantages; and the universality of the corner blocks reduces the stock of components to the blocks, the frame members, the racks and, where required, the panels.

Frames of particular dimensions are easily made up by selecting frame members and racks of appropriate length; and existing frames can be readily expanded by replacing members with others of greater length.

We claim:

1. A rectangular prismatic frame having eight corners and composed of horizontal members and vertical members, united at each of its eight corners by a corner block of unitary construction having three channel-shaped wings at right angles to one another, each wing being shaped and dimensioned to engage telescopically the ends of the frame members at the corners of the frame and the top and bottom corner blocks having holes therein, means to secure the frame members and blocks against separation, and at each corner of the frame a vertical rod passing through the holes in the top and bottom corner blocks and fast with the frame, and adapted to be engaged by lifting means, the members being hollow with their cavities open to the cavities in the wings.

2. The frame of claim 1, in which the lifting means on each rod is a screwnut.

* * * * *